(12) United States Patent
Liang et al.

(10) Patent No.: US 9,589,912 B1
(45) Date of Patent: Mar. 7, 2017

(54) INTEGRATED CIRCUIT STRUCTURE WITH CRACK STOP AND METHOD OF FORMING SAME

(71) Applicant: GLOBALFOUNDRIES Inc., Grand Cayman (KY)

(72) Inventors: Jim S. Liang, Poughkeepsie, NY (US); Atsushi Ogino, Fishkill, NY (US); Stephen E. Greco, Stamford, CT (US); Roger A. Quon, Rhinebeck, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/837,737

(22) Filed: Aug. 27, 2015

(51) Int. Cl.
| | |
|---|---|
| *H01L 23/528* | (2006.01) |
| *H01L 21/31* | (2006.01) |
| *H01L 23/00* | (2006.01) |
| *H01L 23/532* | (2006.01) |
| *H01L 21/311* | (2006.01) |
| *H01L 21/3205* | (2006.01) |
| *H01L 21/3213* | (2006.01) |

(52) U.S. Cl.
CPC ...... *H01L 23/562* (2013.01); *H01L 21/31116* (2013.01); *H01L 21/31144* (2013.01); *H01L 21/32051* (2013.01); *H01L 21/32139* (2013.01); *H01L 23/528* (2013.01); *H01L 23/53209* (2013.01); *H01L 23/53257* (2013.01)

(58) Field of Classification Search
CPC ............... H01L 23/562; H01L 23/528; H01L 23/53209; H01L 23/53257; H01L 21/31116; H01L 21/31144; H01L 21/32051; H01L 21/32139
See application file for complete search history.

(56) References Cited

U.S. PATENT DOCUMENTS

| | | | |
|---|---|---|---|
| 5,665,655 | A | 9/1997 | White |
| 5,789,302 | A | 8/1998 | Mitwalsky et al. |
| 5,834,829 | A | 11/1998 | Dinkel et al. |
| 6,022,791 | A | 2/2000 | Cook et al. |
| 6,033,791 | A | 3/2000 | Smith et al. |
| 6,084,287 | A | 7/2000 | Mitwalsky et al. |
| 6,091,131 | A | 7/2000 | Cook et al. |
| 6,271,578 | B1 | 8/2001 | Mitwalsky et al. |
| 6,365,958 | B1 | 4/2002 | Ibnabdeljalil et al. |
| 6,383,893 | B1 | 5/2002 | Begle et al. |
| 6,492,247 | B1 | 12/2002 | Guthrie et al. |
| 6,650,010 | B2 | 11/2003 | Davis et al. |

(Continued)

FOREIGN PATENT DOCUMENTS

| | | |
|---|---|---|
| EP | 1336200 B1 | 8/2008 |
| JP | 4647061 B2 | 3/2011 |

(Continued)

*Primary Examiner* — Whitney T Moore
(74) *Attorney, Agent, or Firm* — Yuanmin Cai; Hoffman Warnick LLC

(57) ABSTRACT

A first aspect of the disclosure provides for an integrated circuit structure. The integrated circuit structure may comprise a first metal structure in a first dielectric layer on a substrate in a crack stop area; and a first crack stop structure in a second dielectric layer, the first crack stop structure being over the first metal structure and including: a first metal fill contacting the first metal structure; and an air seam substantially separating the first metal fill and the second dielectric layer.

11 Claims, 14 Drawing Sheets

(56) References Cited

U.S. PATENT DOCUMENTS

| | | | |
|---|---|---|---|
| 6,815,346 B2 | 11/2004 | Davis et al. | |
| 7,098,544 B2 | 8/2006 | Edelstein et al. | |
| 7,098,676 B2 | 8/2006 | Landers et al. | |
| 7,109,093 B2 | 9/2006 | Fitzsimmons et al. | |
| 7,112,470 B2 | 9/2006 | Daubenspeck et al. | |
| 7,163,883 B2 | 1/2007 | Agarwala et al. | |
| 7,273,770 B2 | 9/2007 | Edelstein et al. | |
| 7,456,098 B2 | 11/2008 | Hichri et al. | |
| 7,544,602 B2 | 6/2009 | Clevenger et al. | |
| 7,573,130 B1 | 8/2009 | Shaw et al. | |
| 7,679,200 B2 | 3/2010 | Su et al. | |
| 7,955,955 B2 | 6/2011 | Lane et al. | |
| 8,063,469 B2 | 11/2011 | Barth et al. | |
| 8,076,756 B2 | 12/2011 | Lane et al. | |
| 8,188,574 B2 | 5/2012 | Angyal et al. | |
| 8,237,246 B2 | 8/2012 | Angyal et al. | |
| 8,309,435 B2 | 11/2012 | Kaltalioglu et al. | |
| 8,592,941 B2 | 11/2013 | Gambino et al. | |
| 8,604,618 B2 | 12/2013 | Cooney, III et al. | |
| 8,610,238 B2 | 12/2013 | Kaltalioglu et al. | |
| 8,742,594 B2 | 6/2014 | Daubenspeck et al. | |
| 8,970,008 B2 | 3/2015 | Gratz et al. | |
| 8,970,009 B2 | 3/2015 | Ishii | |
| 2003/0234447 A1 | 12/2003 | Yunus et al. | |
| 2004/0150105 A1 | 8/2004 | Yunus et al. | |
| 2007/0087067 A1 | 4/2007 | Yuan et al. | |
| 2009/0065952 A1* | 3/2009 | Su | H01L 23/585 257/778 |
| 2009/0096104 A1* | 4/2009 | Lee | H01L 23/564 257/758 |
| 2010/0283128 A1 | 11/2010 | Chen | |
| 2011/0074033 A1 | 3/2011 | Kaltalioglu et al. | |
| 2011/0140245 A1 | 6/2011 | Lane et al. | |
| 2012/0074519 A1 | 3/2012 | Yeo et al. | |
| 2013/0099391 A1 | 4/2013 | Lamorey et al. | |
| 2014/0339703 A1 | 11/2014 | Farooq et al. | |

FOREIGN PATENT DOCUMENTS

| | | |
|---|---|---|
| JP | 4776195 B2 | 9/2011 |
| JP | 5613290 B2 | 10/2014 |
| WO | 2007047058 A2 | 4/2007 |

* cited by examiner

INTEGRATED CIRCUIT STRUCTURE WITH CRACK STOP AND METHOD OF FORMING SAME

BACKGROUND

Technical Field

The present disclosure relates to integrated circuits, and more specifically, integrated circuit structures with a crack stop structure having an air seam, and a method of forming the same.

Related Art

In semiconductor fabrication, many integrated circuit (IC) chips are formed in parallel on a single wafer. The wafer typically includes a substrate on which the IC chips are fabricated. The IC chips may be fabricated by the formation and patterning of various device layers. The IC chips may be separated by a channel which generally includes a dielectric. Once the IC chips are completed, the wafer is diced into separate the chips. However, one or more cracks may form in the channel during dicing. Further, these cracks may propagate into the IC chips and cause failure. Therefore, crack stops have been employed to prevent propagation of cracks from the channel to the active regions of the IC chips.

SUMMARY

A first aspect of the disclosure provides for an integrated circuit structure. The integrated circuit structure may comprise a first metal structure in a first dielectric layer on a substrate in a crack stop area; and a first crack stop structure in a second dielectric layer, the first crack stop structure being over the first metal structure and including: a first metal fill contacting the first metal structure; and an air seam substantially separating the first metal fill and the second dielectric layer.

A second aspect of the disclosure provides for a method of forming a crack stop structure. The method may comprise: forming a first dielectric layer over a substrate in a crack stop area, the crack stop area laterally adjacent to an active area and the first dielectric layer having a first metal structure; forming a first opening in a second dielectric layer over the first dielectric layer to expose an upper surface of the first dielectric layer in the crack stop area adjacent to the active area, the second dielectric layer defining a pair of sidewalls of the first opening; and depositing a first metal fill in the first opening and over the first metal structure such that an air seam is formed between the first metal fill and the second dielectric at the sidewalls of the first opening, thereby forming a first crack stop structure.

A third aspect of the disclosure may comprise an integrated circuit structure comprising: a first metal level including: a first metal structure in a first dielectric layer on a substrate in a crack stop area; and a first crack stop structure in a second dielectric layer, the first crack stop structure being over the first metal structure and including: a first metal fill contacting the first metal structure; and an air seam substantially separating the first metal fill and the second dielectric layer, the air seam having a width of approximately 1 angstrom to 10 approximately angstroms; wherein the first crack stop structure extends from the first dielectric layer to an uppermost metal level on the substrate.

BRIEF DESCRIPTION OF THE DRAWINGS

The embodiments of this disclosure will be described in detail, with reference to the following figures, wherein like designations denote like elements, and wherein.

DETAILED DESCRIPTION

Aspects of the present disclosure relate to integrated circuits, and more specifically, integrated circuits with a crack stop structure having an air seam, and a method of forming the same.

Figure 1:
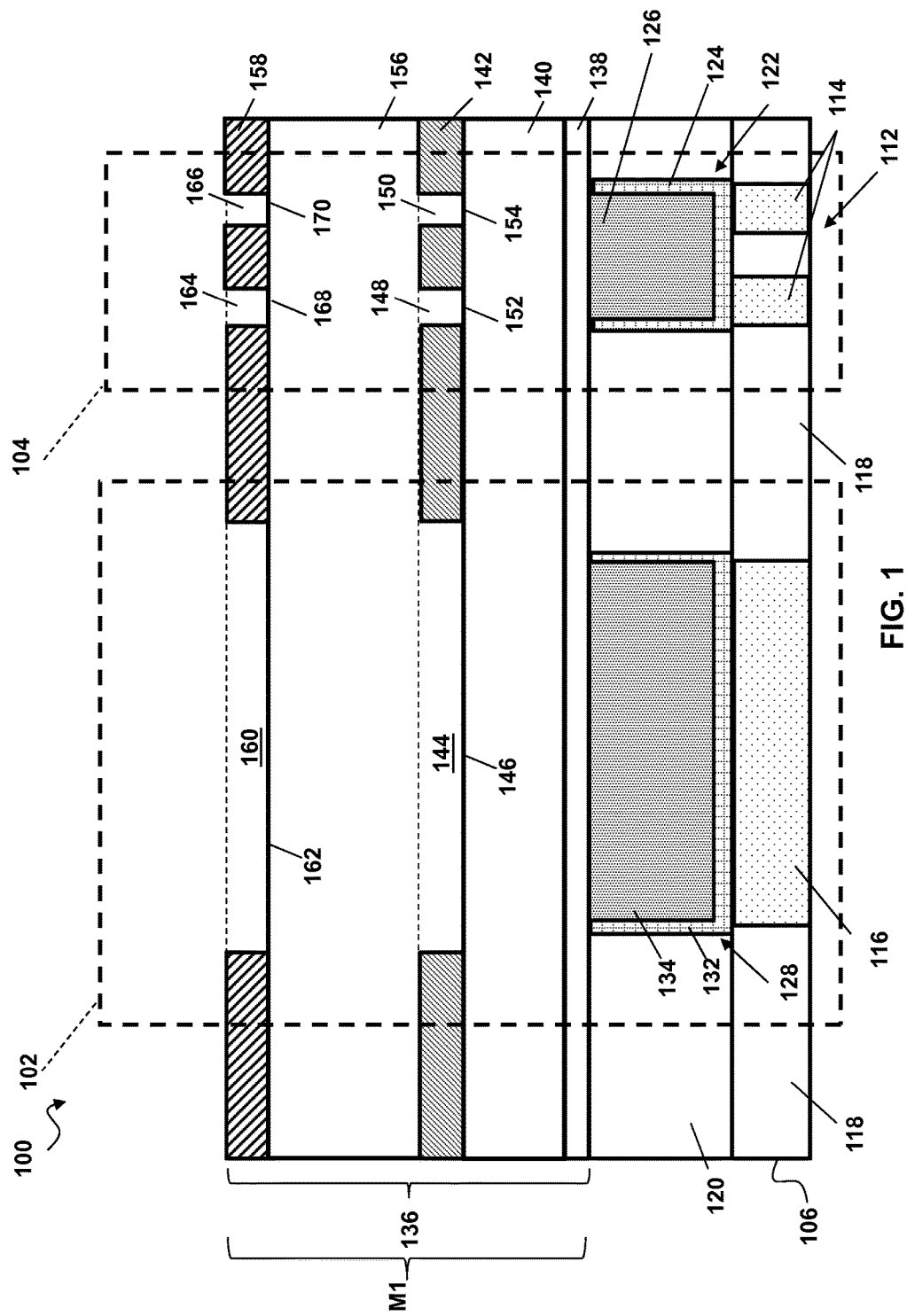
FIGS. 1-9 show an integrated circuit being processed in a method according to embodiments of the disclosure.

FIG. 1 shows an integrated circuit (IC) structure 100. IC structure 100 may include a crack stop area 102 laterally adjacent to an active area 104 on a wafer (not shown). Crack stop area 102 may include an area which is configured to prevent propagation of cracks caused by dicing the wafer. As will be described herein, a crack stop structure may be formed in crack stop area 102. Active area 104 may include an area which is part of the electrical circuit of a chip (not shown) on the wafer and may be comprised of various semiconductor structures as known in the art, such as for example, transistors, capacitors, resistors, etc. FIG. 1 shows IC structure 100 including a substrate 106. In active area 104, substrate 106 can include a semiconductor device, such as for example, a fin-shaped field-effect transistor (FINFET) 112 having a pair of fins 114 as known in the art. It is to be understood that FINFET 112 may include an epitaxial layer over each fin and a gate stack known in the art but not included herein for brevity. FINFET 112 may be formed by conventional deposition and photolithography techniques as known in the art. In crack stop area 102, a semiconductor layer 116 may be formed. Semiconductor layer 116 may be formed by etching an opening and depositing a semiconductor material therein. Subsequently, a planarization technique may be employed such that semiconductor layer 116 is flush with a top surface of the opening. Semiconductor layer 116 and fins 114 may include but are not limited silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor layer 116 and fins 114 may be strained. Substrate 106 can also include shallow trench isolations (STIs) 118 positioned laterally between, e.g., semiconductor layer 116 and fins 114. STI(s) 118 can be formed by removing portions of substrate 106 to form openings and then filling the openings with an electrically insulative material such as for example, silicon dioxide (SiO2), silicon nitride (SiN), hafnium oxide (HfO2), alumina (Al2O3), yttrium oxide (Y2O3), tantalum oxide (Ta2O5), titanium dioxide (TiO2), praseodymium oxide (Pr2O3), zirconium oxide (ZrO2), erbium oxide (ErOx), and other currently known or later developed materials having similar properties.

As used herein, "etching" may include any now known or later developed techniques appropriate for the material to be etched including but not limited to, for example: isotropic etching, anisotropic etching, plasma etching, sputter etching, ion beam etching, reactive-ion beam etching and reactive-ion etching (RIE). As used herein, and unless otherwise noted, the term "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Planarization refers to various processes that make a surface more planar (that is, more flat and/or smooth). Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a plastic retaining ring. The dynamic polishing head is rotated with different axes of rotation (that is, not concentric). This removes material and tends to even out any "topography," making the wafer flat and planar.

Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

It will be understood that when an element as a layer, region or substrate is referred as being "on" or "over" another element, it can be directly on the other element or intervening elements may be present. It will also be understood that when an element is referred to as being "connected" or "coupled" to another element, it can be directly connected or couple to the other element or intervening elements may be present.

Still referring to FIG. 1, a middle of the line (MOL) stack 120 may be formed on substrate 106. MOL stack 120 may include a dielectric material such as for example, silicon nitride ($Si_3N_4$), silicon oxide ($SiO_2$), fluorinated $SiO_2$ (FSG), hydrogenated silicon oxycarbide (SiCOH), porous SiCOH, boro-phoso-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or multiple layers thereof. Within MOL stack 120, a contact 122 may be formed in active area 104. Contact 122 may include a liner layer 124 and a metal fill 126. Liner layer 124 may include a refractory metal such tantalum Nitride (TaN) and/or tantalum (Ta). Other refractory metals such as titanium (Ti), tungsten (W), iridium (Ir), rhodium (Rh) and platinum (Pt), etc., or mixtures of thereof, may also be included may employed as well. Metal fill 126 may include a metal, such as tungsten (W), copper (Cu), aluminum (Al), and cobalt (Co). Contact 122 may be formed by etching an opening in MOL stack 120, depositing liner layer 124 to coat the opening and depositing metal fill 126 to fill the opening. Additionally, a planarization technique may be employed to polish liner layer 124 and metal fill 126 to a top surface of the opening, or more particularly, to a top surface of MOL stack 120.

While contact 122 is being formed in active area 104, a metal structure 128 may be simultaneously formed in crack stop area 102. Metal structure 128 in crack stop area 102 may be formed in much of the same way as contact 122 in active area 104 and may include a liner layer 132 and a metal fill 134. Liner layer 132 and metal fill 134 may include the liner layer materials and metal fill materials previously discussed. However, as previously explained, there is no current that flows through crack stop area 102 so no current will flow through metal structure 128 of crack stop area 102.

Still referring to FIG. 1, a dielectric layer 136 may be formed over MOL stack 120 such that dielectric layer 136 defines a first metal level M1 on substrate 106. However, in other embodiments of the disclosure, other metal levels (not shown) may exist between first metal level M1 and substrate 106. Dielectric layer 136 may include a plurality of layers such that dielectric layer 136 may be considered as a dielectric stack. As shown in FIG. 1, dielectric layer 136 may formed by first depositing a barrier layer having a low dielectric constant (hereinafter referred to as "barrier low-k layer") 138 over MOL stack 120. Barrier low-k layer 138 may include, but is not limited to: nitrogen (N) doped silicon carbide (SiC), silicon carbide (SiC), silicon nitride (SiN), carbon (C) doped silicon nitride, and combinations thereof. Additionally, an interlayer dielectric layer having a low dielectric constant (hereinafter referred to as "low-k ILD") 140 may also be deposited. Low-k ILD 140 may include, for example, but is not limited to a material with a lower dielectric constant than barrier low-k layer 138, and in an embodiment can be composed of a material having a dielectric constant less than approximately 3.9, or more particularly, between approximately 1.0 and approximately 2.0.

At this point, a first hard mask 142 may be formed over low-k ILD 140. First hard mask 142 may include, but is not limited to: titanium nitride (TiN), tantalum nitride (TaN), and tungsten nitride (WN). First hard mask 142 may be deposited over low-k ILD 140 and patterned. First hard mask 142 may be patterned such that a first hard mask opening 144 is formed to expose a portion 146 of low-k ILD 140 that is over metal structure 128 of MOL 120 in crack stop area 102. Further, in active area 104, first hard mask 142 may be patterned such that a second hard mask opening 148 and third hard mask opening 150 are formed to expose portions 152, 154 of low-k ILD 140 that is over each fin 112 of FINFET 112.

Also shown in FIG. 1, formation of dielectric layer 136 may include depositing an organic planarization layer hard mask (hereinafter referred to as "OPL hard mask") 156 over first hard mask 142 and hard mask openings 144, 148, 150. That is, OPL hard mask 156 may be deposited such that it covers portions 146, 152, 154 of low-k ILD 140 within hard mark openings 144, 148, 150. OPL hard mask 156 includes an organic planarization material, which may be a self-planarizing organic material that may include carbon, hydrogen, oxygen, and optionally nitrogen, fluorine, and silicon. In one embodiment, the self-planarizing organic material can be a polymer with sufficiently low viscosity so that the top surface of the applied polymer forms a planar horizontal surface. In one embodiment, OPL hard mask 156 can include a transparent organic polymer. Non-limiting examples of organic planarizing material include, but are not limited to, CHM701B, commercially available from Cheil Chemical Co., Ltd., HM8006 and HM8014, commercially available from JSR Corporation, and ODL-102 or ODL-401, commercially available from ShinEtsu Chemical, Co., Ltd. OPL hard mask 156 planarizes patterned first hard mask 142.

Formation of dielectric layer 136 may also include depositing a low temperature oxide hard mask (hereinafter referred as "LTO hard mask") 158 over OPL hard mask 156. LTO hard mask 158 may include, but is not limited to: octamethylcyclotetrasiloxane (OMCTS) oxide and low temperature silicon nitride (SiN). LTO hard mask 158 may be patterned such that a fourth hard mask opening 160 is formed to expose a portion 162 of OPL hard mask 156 over metal structure 128 in crack stop area 102. Further, in active area 104, LTO hard mask 158 may be patterned such that a fifth hard mask opening 164 and a sixth hard mask opening 166 are formed to expose portions 168, 170 of OPL hard mask 156 that is over each fin 112 of FINFET 112.

Figure 2:
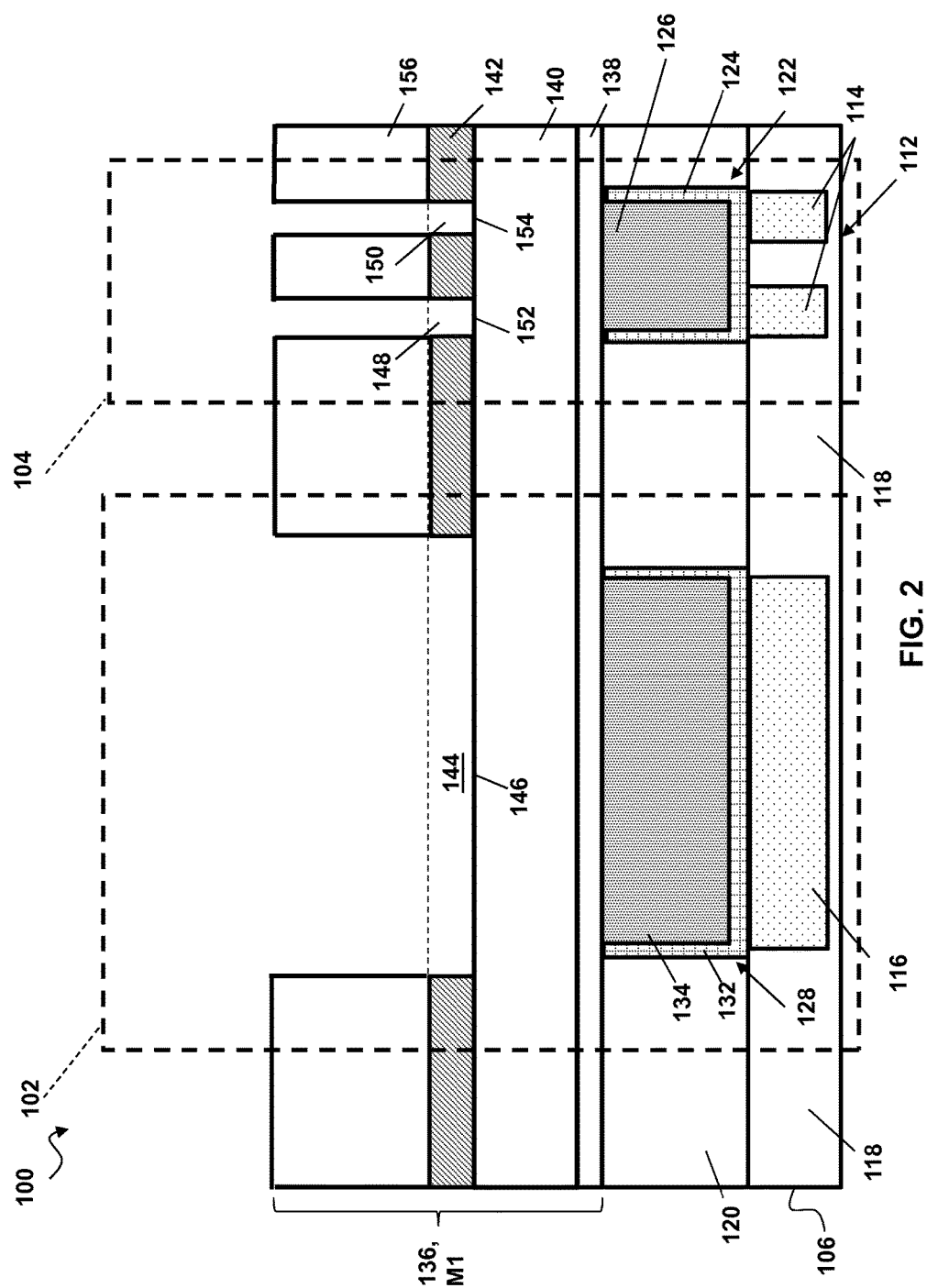
Figure 3:
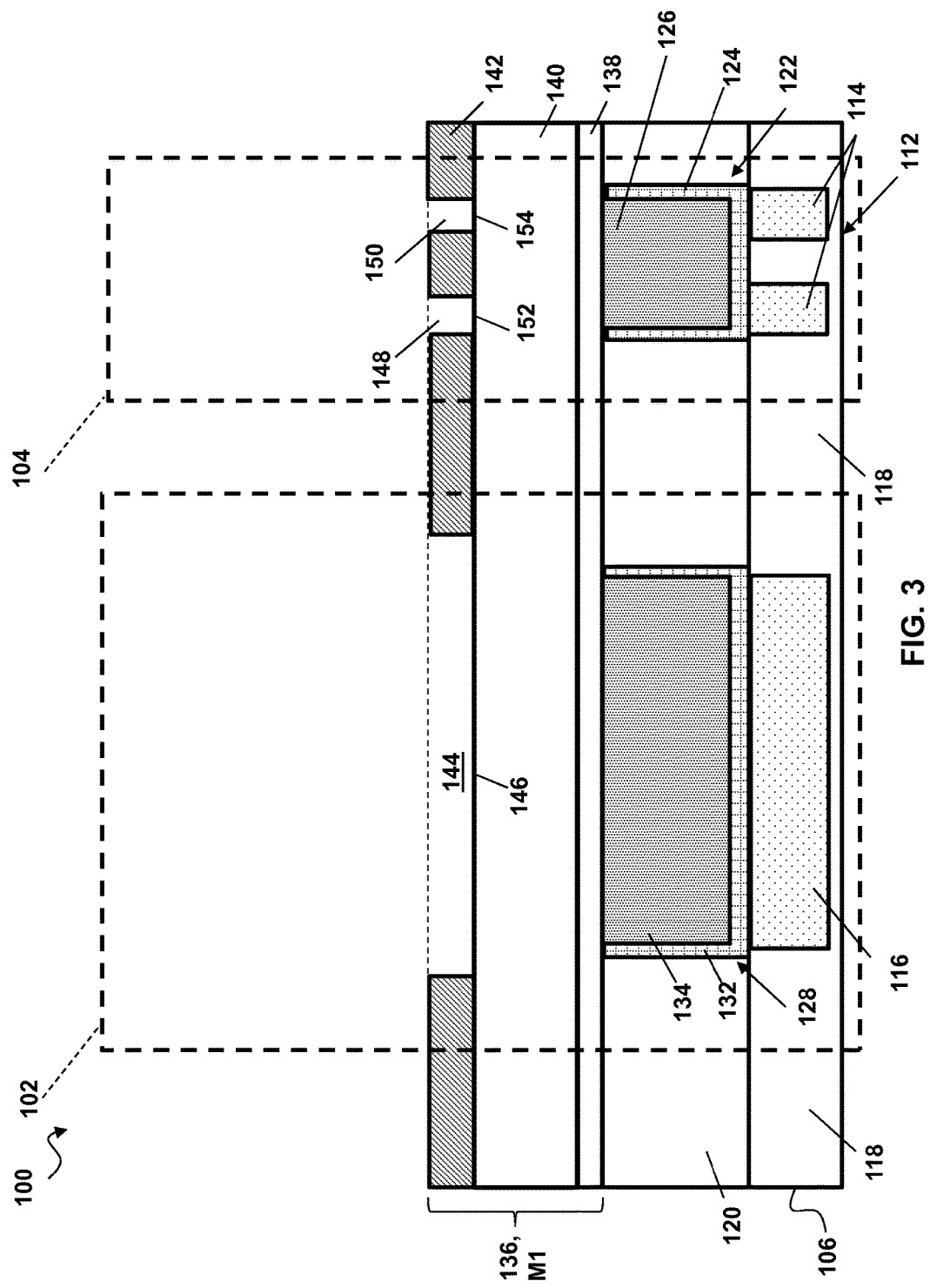
Figure 4:
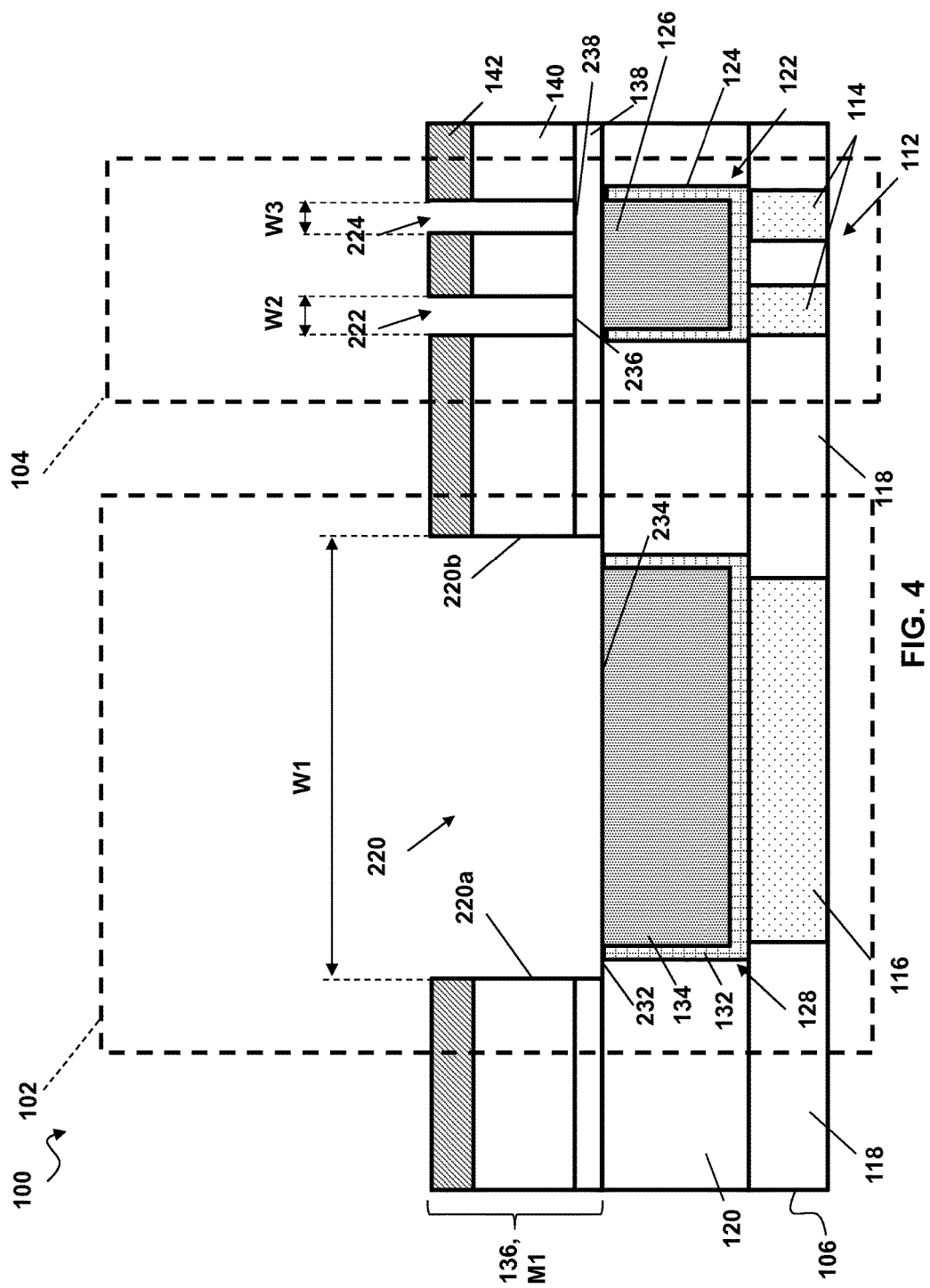

As shown in FIGS. 2-4, once dielectric layer 136 is formed, an opening 220 (FIG. 4) may be formed in dielectric layer 136 to expose an upper surface 232 of MOL stack 120 in crack stop area 102. As shown in FIG. 2, formation of opening 220 may include removing LTO hard mask 158 and OPL hard mask 156 and patterning low-k ILD 140 using self-aligned via reactive ion etch (SAV RIE) processes as known in the art. More specifically, the SAV RIE process etches hard mask opening 160 (FIG. 1) down to hard mask opening 144 such that portion 146 of low-k ILD 140 over metal structure 128 of MOL 120 in crack stop area 102 is exposed. Additionally, the SAV RIE process may etch hard mask openings 164, 166 (FIG. 1) down to hard mask openings 148, 150 such that portions 152, 154 of low-k ILD 140 over contact 122 of MOL 120 in active area 104 are exposed. That is, portions 162, 168, 170 of OPL hard mask 156 that are exposed by hard mask openings 160, 164, 166 may be removed such that a portion of low-k ILD 140 in hard mask openings 144, 148, 150 is exposed. Subsequently, LTO hard mask 158 may be removed.

As shown in FIG. 3, an oxygen ash may be applied to remove the remaining portions of OPL hard mask 156. As shown in FIG. 4, opening 220, opening 222, and opening 224 may be formed. Opening 220 may have a width W1 of approximately 8 microns to approximately 10 microns. Openings 222, 224 may each have a width W2, W3 of approximately 30 nanometers to approximately 100 nanometers. Openings 220, 222, 224 may be formed by any of the etching techniques previously discussed. In one example, openings 220, 222, 224 may be formed by RIE. As is known in the art of semiconductor fabrication, RIE uses chemically reactive plasma to remove material deposited on wafers/substrates. Differences in width between these openings may allow for utilizing a phenomenon known as RIE lag. RIE lag is a phenomenon that limits etching depth as a function of the critical dimension (e.g., width or diameter when viewed in plan view) of the printed image on the surface of a wafer being etched. RIE lag is an artifact of the long diffusion path from the surface of the wafer to bottom of the trench. The long diffusion path limits the availability of reactive etch species at the etch front (e.g., leading edge), and also limits the ability to evacuate the reaction by-products. RIE lag is particularly prevalent when etching high aspect ratio trench holes, where aspect ratio is defined as the ratio of the depth of the etched structure relative to its width or its diameter in plan view (e.g., the critical dimension). In general, RIE lag will cause smaller cross-sections of a material to be etched more slowly than larger cross-sections of the same material. As shown in FIG. 4, opening 220 is etched to expose an upper surface 232 of a portion of MOL stack 120 and an upper surface 234 of metal structure 128 in crack stop area 102. That is, opening 220 exposes a portion of low-k ILD 140 that is exposed by first hard mask opening 144 and barrier low-k layer 138 thereunder. Dielectric layer 136 may be etched such that dielectric layer 136 defines a pair of sidewalls 220a, 220b of opening 220. However, due to inverse RIE lag, openings 222, 224 are only etched to expose portions 236, 238 of barrier low-k layer 138.

Figure 5:
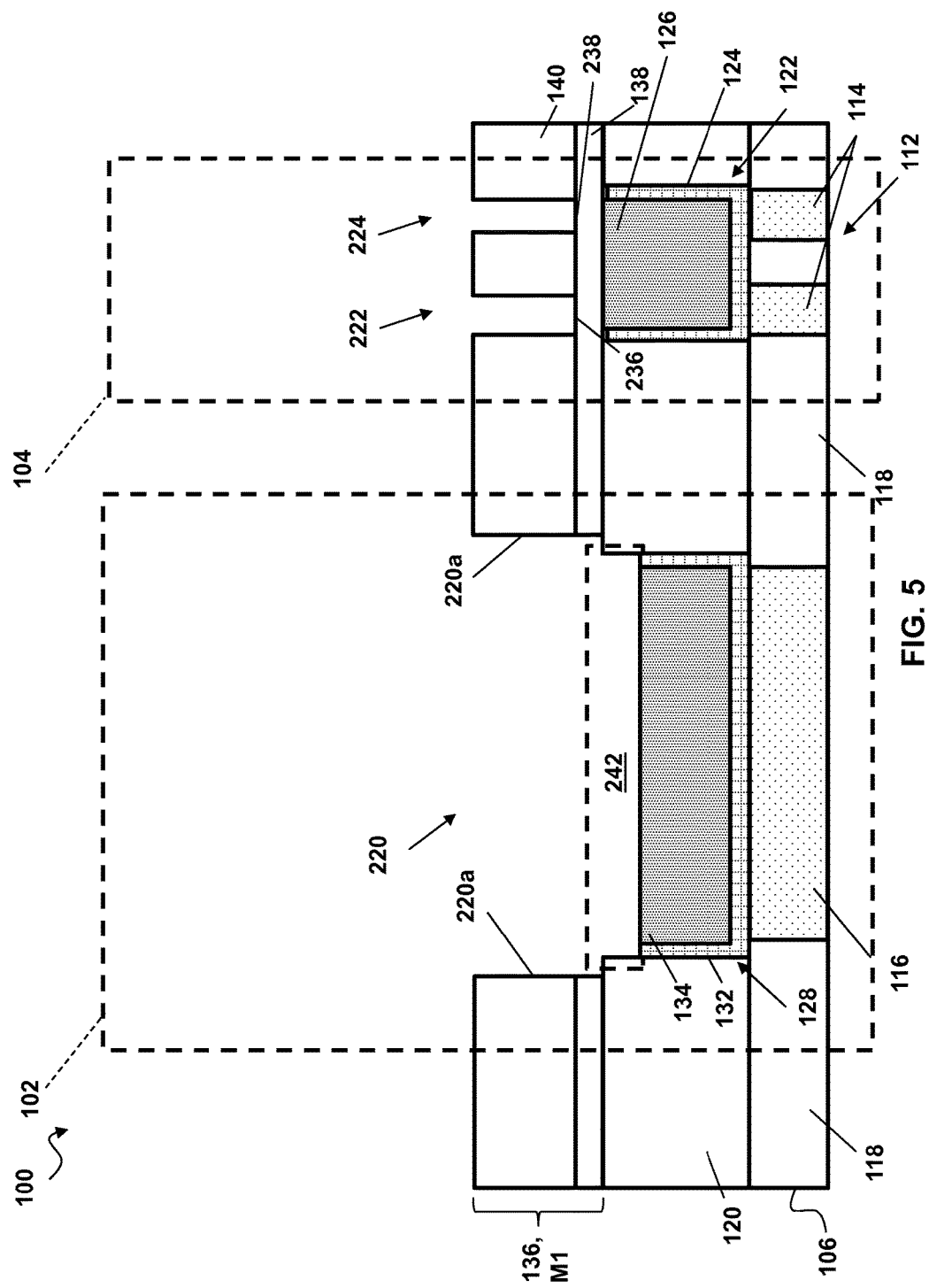

As shown in FIG. 5, first hard mask 142 and a portion 242 (shown by dotted box) of metal structure 128 may be removed. That is, an etch process using a wet chemistry that is selective to dielectrics and silicon (Si) is used to completely remove first hard mask 142 and partially remove liner layer 132 and metal fill 134 of metal structure 128. During this step, contact 122 in active area 104 remains untouched as it is protected by barrier low-k layer 138.

Figure 6:
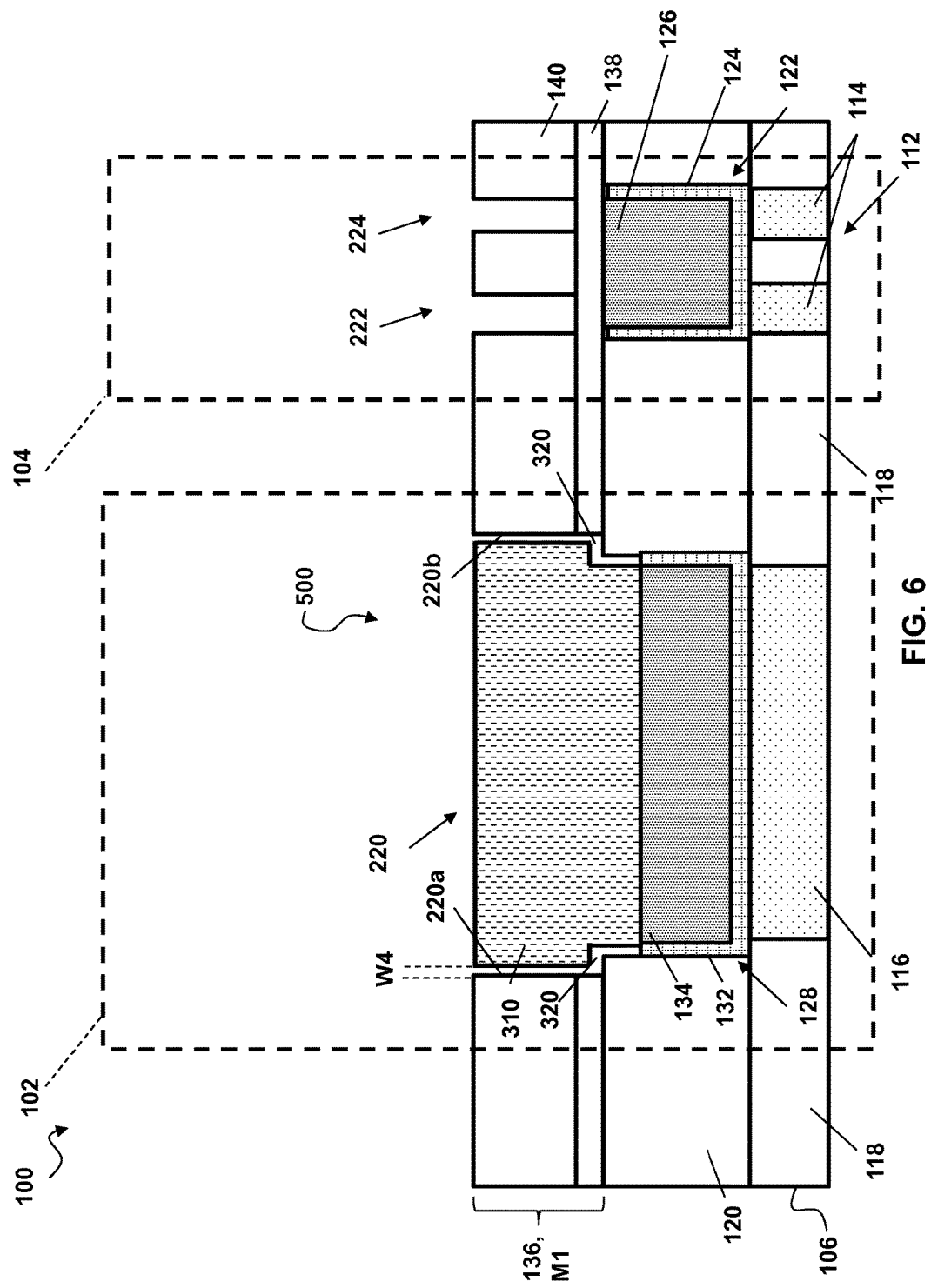

Referring now to FIG. 6, another metal fill 310 may be deposited to substantially fill first opening 220 and contacts metal structure 128. As used herein "substantially" refers to largely, for the most part, entirely specified or any slight deviation which provides the same technical benefits of the disclosure. Metal fill 310 may include a metal such as: selective cobalt (Co), selective tungsten (W), or selective aluminum (Al). In this step, due to the selective nature of metal fill 310, metal fill 310 only deposits on metals and not dielectrics. Therefore, as shown in FIG. 6, metal fill 310 will bond with metal fill 134 in metal structure 128 and air seams 120 are formed between metal fill 310 and dielectric layer 136 at sidewalls 220a, 220b of opening 220. More particularly, air seams 320 are formed between metal fill 310 and barrier low-k layer 138 and low-k ILD 140 due to the lack of bonding between metal fill 310 and barrier low-k layer 138 and low-k ILD 140. As such, opening 220 will not be completely filled. As opposed to air gaps which on the macroscopic scale, or typically a few nanometers or more in width, air seams 320 are microscopic, and may have a width W4 of approximately 1 angstrom to approximately 10 angstroms. Due to the relatively smaller width of air seams 320, IC structure 100 is more mechanically robust than crack stop structures having air gaps. Additionally, metal fill 310 will not be deposited in active area 104 since no metals are exposed. That is, due to the RIE lag that causes barrier low-k layer 138 to remain over fins 114 in active area 104, metal fill 310 will not deposit in openings 222, 224 in active area 104. Air seams 320 prevent the propagation of cracks past crack stop area 102 and protect active area 104. FIG. 6 also shows resulting crack stop structure 500 as formed by the method described herein. Crack stop structure 500 may include opening 220 in a dielectric layer 136, dielectric layer 136 being over a substrate 106 of a wafer (not shown) in a crack stop area 102 of the wafer and a metal fill 310 in first trench 220 and contacting contact 128 thereunder. Metal fill 310 may include a metal that is selective to other metals such that at least one air seam 320 is formed in opening 220. Air seam 320 substantially separates the metal of metal fill 310 and dielectric 128. In one example, metal fills 126, 134 may each include tungsten (W) and metal fill 310 may include cobalt (Co). In another example, each metal fill 126, 134, 310 may include cobalt (Co).

Figure 7:
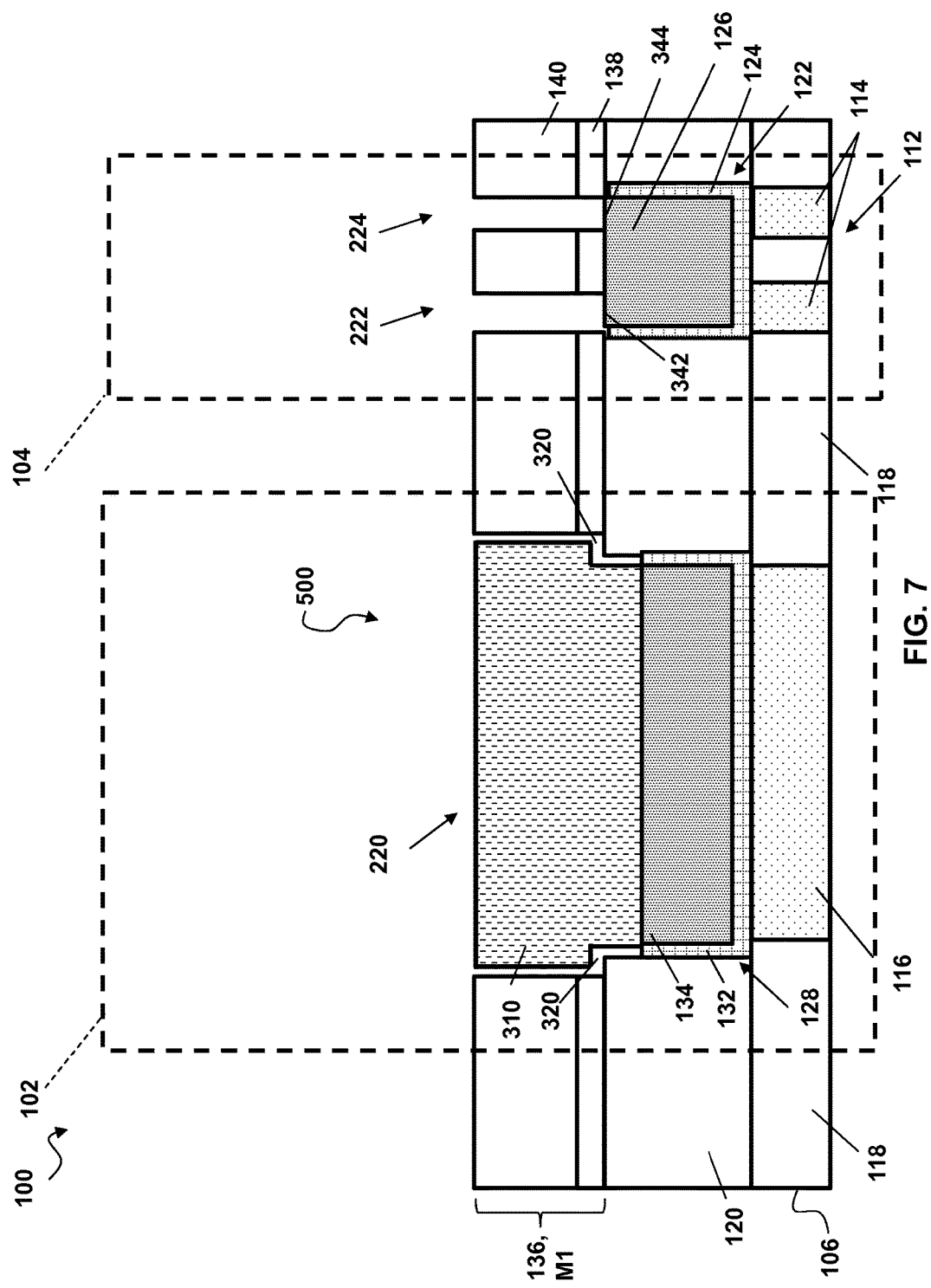

As shown in FIG. 7, once second metal fill 310 is deposited, barrier low-k layer 138 may be removed from openings 222, 224 to expose portions 342, 344 of contact 122 in active area 104. Barrier low-k layer 138 may be removed by etching wherein the remainder of semiconductor structure is protected by a hard mask (not shown).

Figure 8:
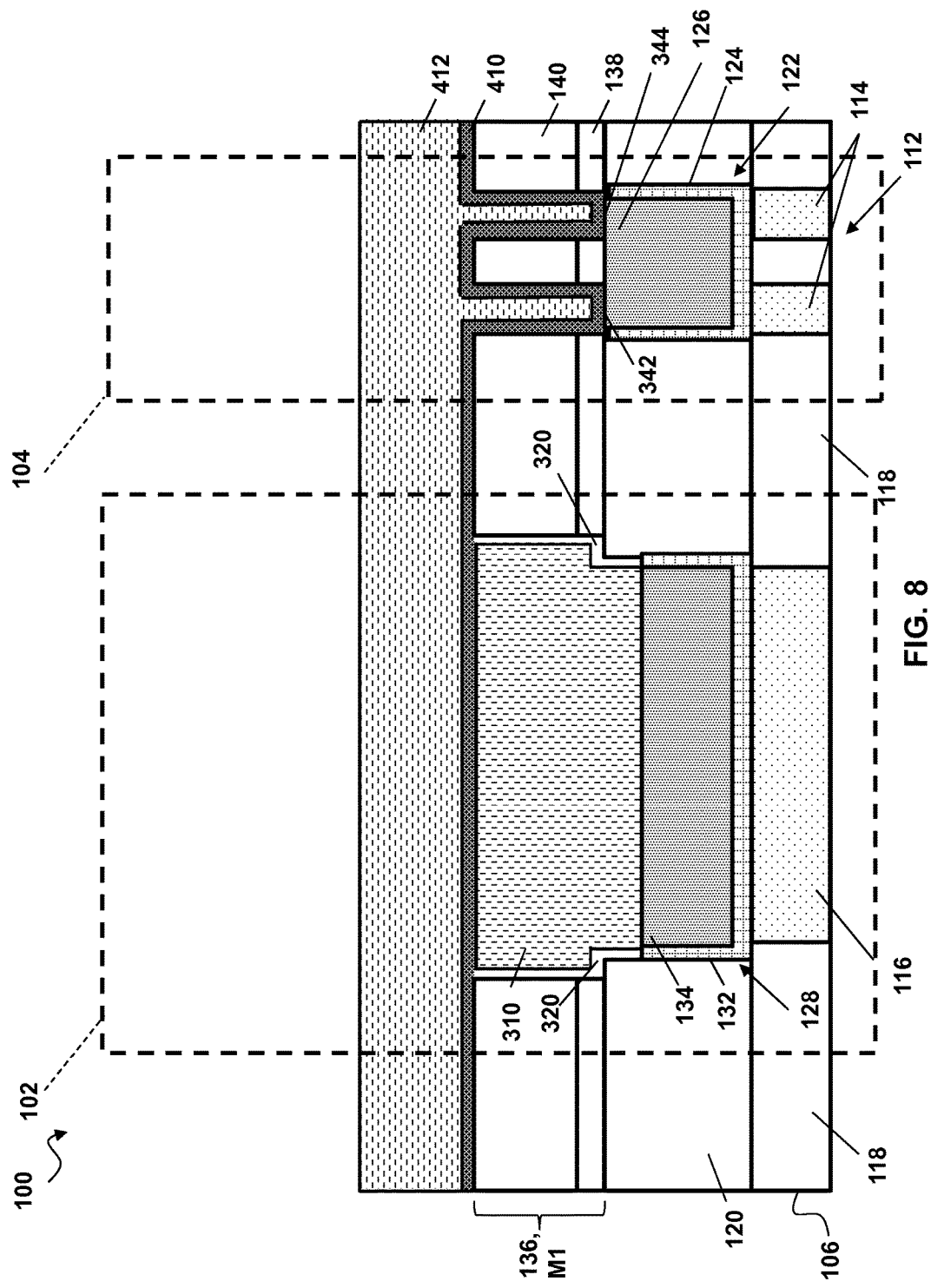
Figure 9:
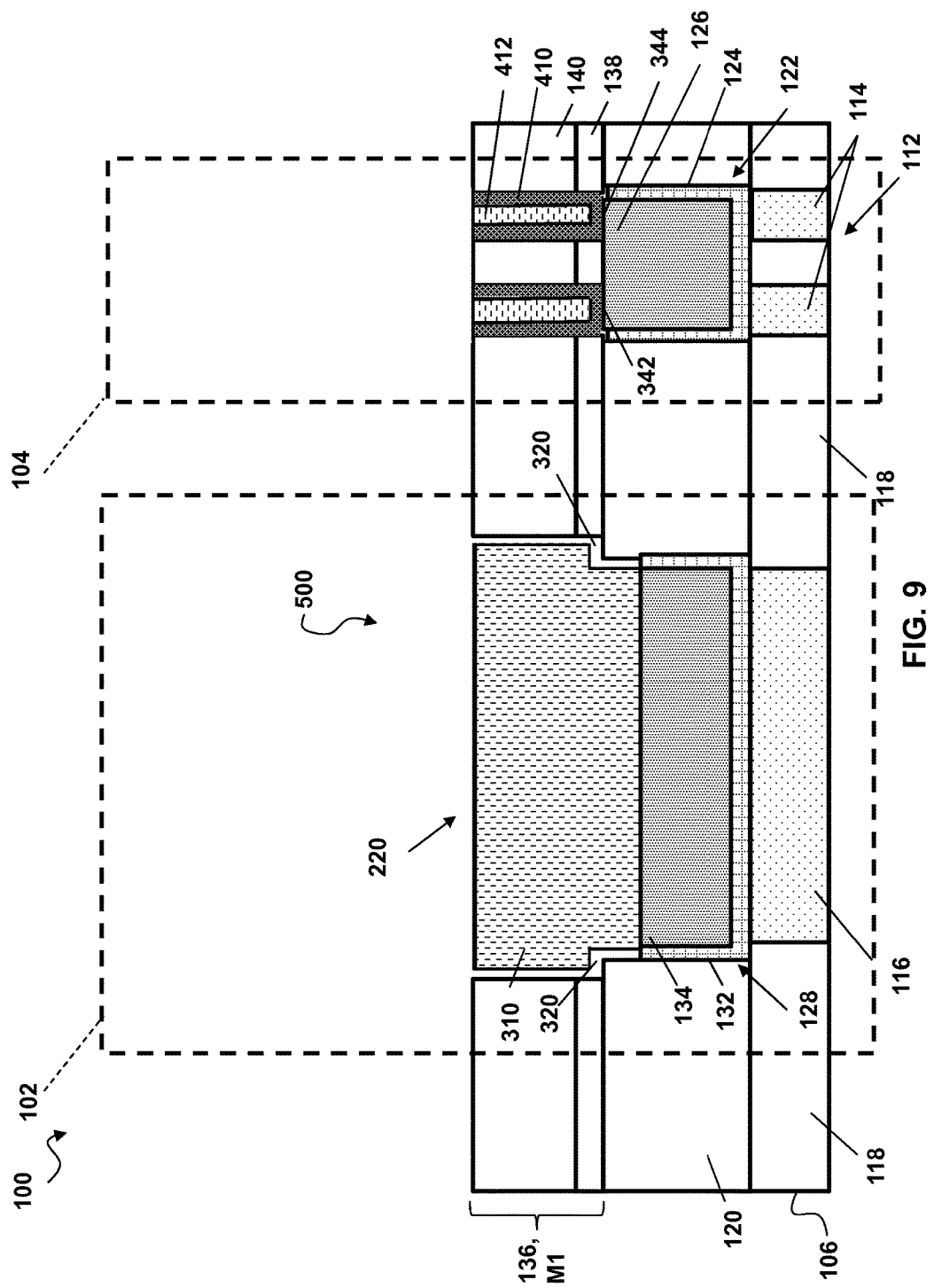
Figure 10:
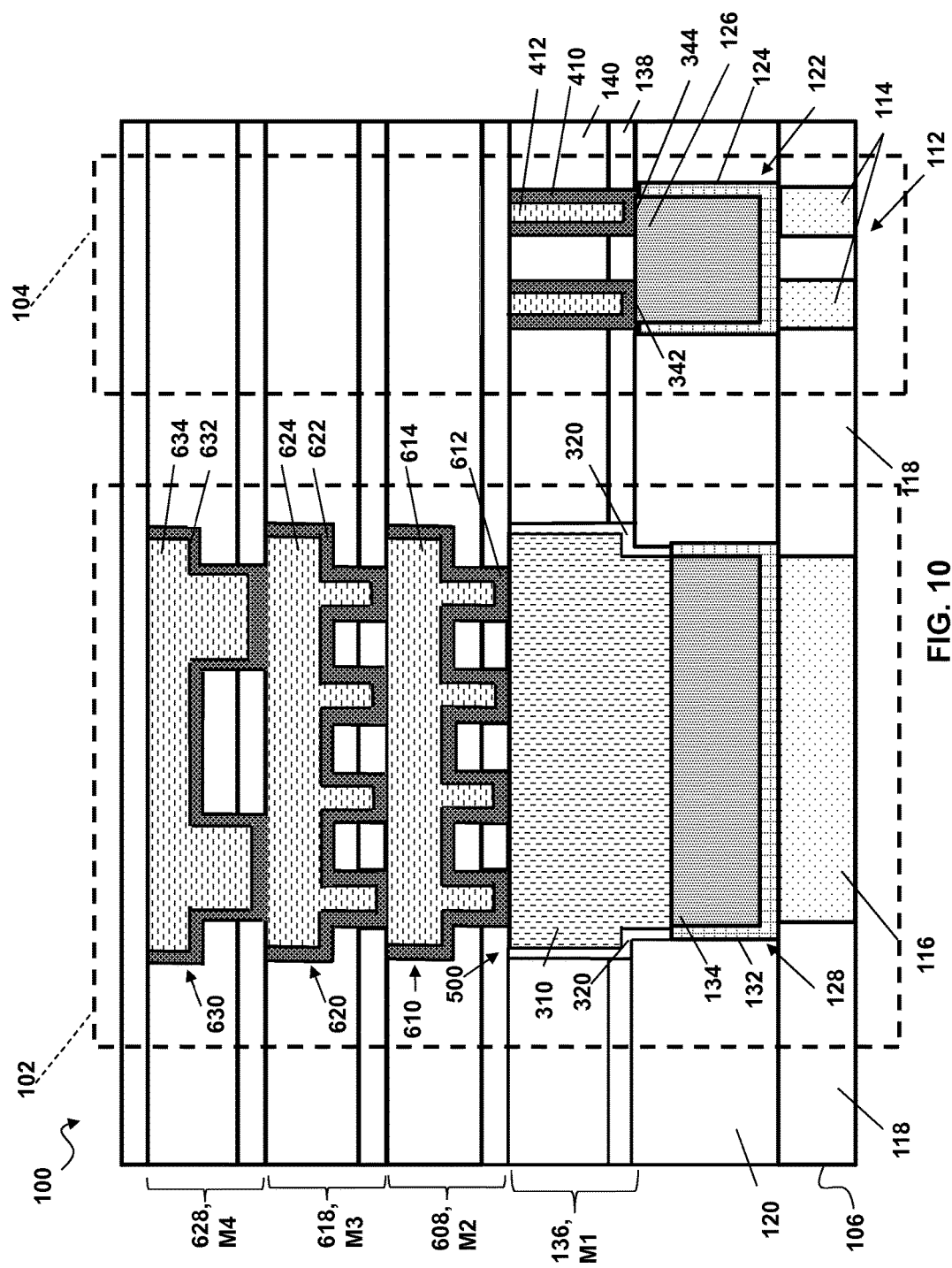
FIG. 10 shows an integrated circuit with additional metal levels according to one embodiment of the disclosure.

At this point, back end of the line (BEOL) metallization may be performed. As shown in FIG. 8, in one example, BEOL metallization may include depositing a liner layer 410 and a metal plating layer 412. In this example, liner layer 410 may be deposited over low-k ILD 140, metal fill 310, and air seams 320 in crack stop area 102. Liner layer 410 does not penetrate air seams 320 due surface tension and the microscopic size of air seams 320. Additionally, liner layer 410 may substantially coat openings 222, 224 (FIG. 7) in active area 104. Metal plating layer 412 may be deposited over liner layer 410 and may substantially fill openings 222, 224 (FIG. 7) in active area 104. As shown in FIG. 9, IC structure 100 may undergo planarization to remove portions of second liner layer 410 and metal plating layer 412 that are outside of trenches 222, 224 (FIG. 7).

Once the BEOL metallization is complete, additional metal levels M2, M3, M4 may be formed on metal level M1. While only three additional metal layers are shown, it is to be understood that any number of metal levels may be formed without departing from embodiments of the disclosure. Additionally, while active area 104 does not show any additional semiconductor devices formed in metal levels M2, M3, M4, it is to be understood any number or type of semiconductor devices can be formed as desired in active area 104. The formation of additional metal levels M2, M3, M4 may include, for example, forming additional crack stop structures 610, 620, 630 without air seams via conventional deposition and etching processes on crack stop structure 500. Each metal level M2, M3, M4 may include a dielectric layer 608, 618, 628. Crack stop structures 610, 620, 630 may formed in dielectric layers 608, 618, 628 and may each include a liner layer 612, 622, 632 and a metal fill 614, 624, 634. Liner layers 612, 622, 632 and metal fills 614, 624, 624 may include any of the liner layer materials and metal fill materials previously discussed. For example, second metal level M2 may be formed over first metal level M1. Second metal level M2 may include dielectric layer 608. An opening may be formed in dielectric layer 608 such that crack stop structure 500 is exposed by opening. Liner layer 612 may be deposited to substantially coat the opening in second metal level M2 and contact crack stop structure 500 thereunder. Additionally, metal fill 614 may be deposited to substantially fill the opening. Subsequently, a planarization technique may be performed such that liner layer 612 and metal fill 614 are substantially flush with the opening in second metal layer M2. Third metal level M3 may be formed over second metal level M2. Third metal level M3 may include a dielectric layer 618. An opening may be formed in dielectric layer 618 such that crack stop structure 620 is exposed by opening. Liner layer 622 may be deposited to substantially coat the opening in third metal level M3 and contact crack stop structure 610 thereunder. Additionally, metal fill 624 may be deposited to substantially fill the opening. Subsequently, a planarization technique may be performed such that liner layer 622 and metal fill 624 are substantially flush with the opening in third metal level M3. Fourth metal level M4 may be formed over third metal level M3. Fourth metal level M4 may include a dielectric layer 628. An opening may be formed in dielectric layer 628 such that crack stop structure 620 is exposed by opening. Liner layer 632 may be deposited to substantially coat the opening in fourth metal level M4 and contact crack stop structure 620 thereunder. Additionally, metal fill 634 may be deposited to substantially fill the opening. Subsequently, a planarization technique may be performed such that liner layer 632 and metal fill 634 are substantially flush with the opening in fourth metal level M4.

Figure 11:
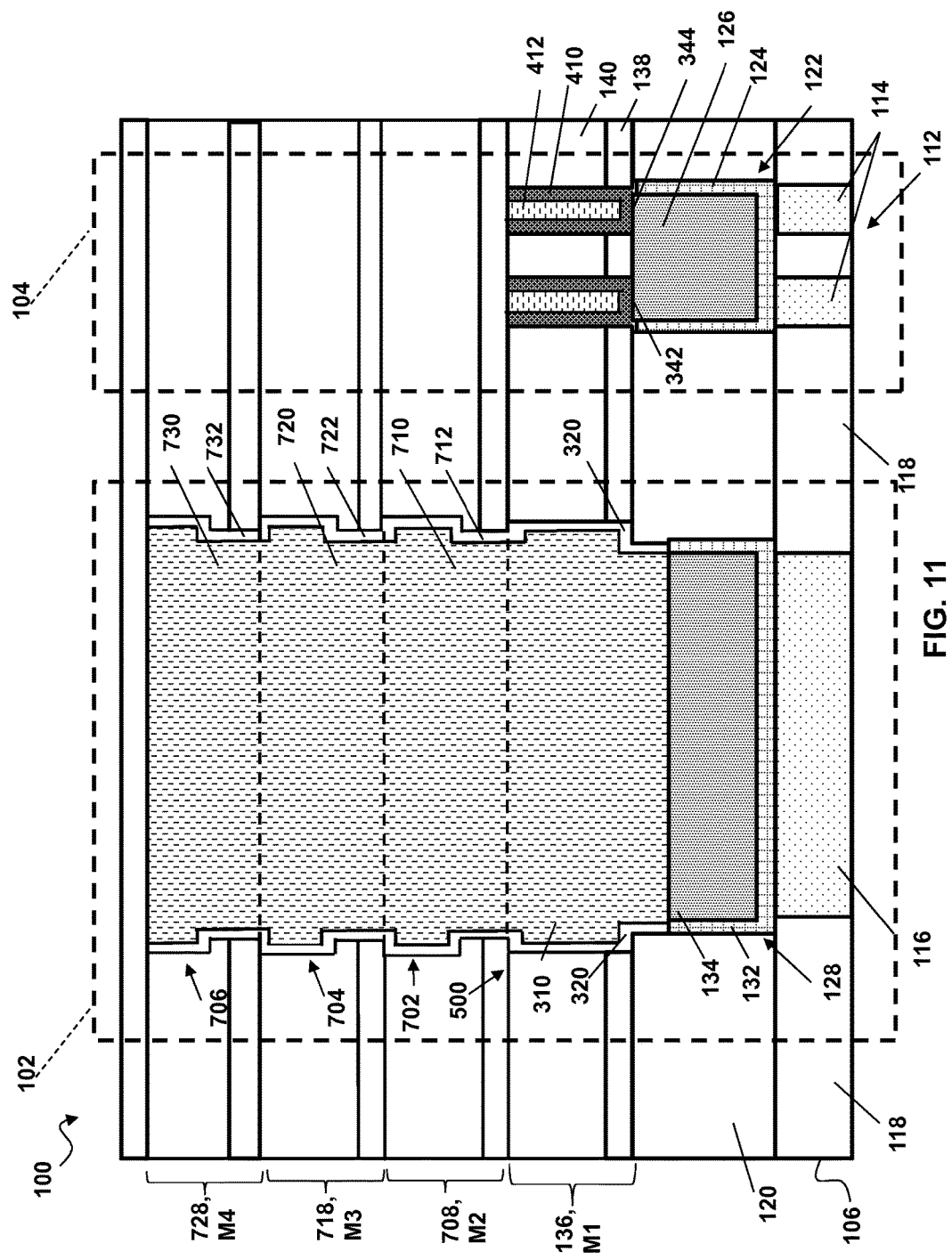
FIG. 11 shows an integrated circuit with additional metal levels according to another embodiment of the disclosure.

In another example, as shown in FIG. 11, the formation of additional metal levels M2, M3, M4 may include extending crack stop structure 500 from MOL stack 120 to an uppermost metal layer on the wafer. That is, as each additional metal level M2, M3, M4 is formed, an opening may be formed in each metal level M2, M3, M4 to expose the metal fill of the underlying metal level M1, M2, M3 and additional amounts of metal fill may be deposited to substantially fill each respective opening in each metal level M2, M3, M4. Each subsequently formed metal fill may bond with the metal fill in the metal level thereunder such that first crack stop structure 500 may extend from MOL stack 120 to an uppermost metal level on substrate 106. Each metal level M2, M3, M4 may include a dielectric layer 708, 718, 728. More specifically, second metal level M2 may be formed over first metal level M1. The process as described with respect to FIGS. 1-9 may be repeated for second metal level M2. However, it is to be understood that the description with respect to the process in active area 104 may be slightly different depending on the semiconductor structures that are desired to be formed in active area 104 in second metal level M2. That is, a crack stop structure 702 may be formed over crack stop structure 500 such that crack stop structure 702 is a continuation of crack stop structure 500 in second metal level M2. Crack stop structure 702 may include metal fill 710 and air seam 712 such that metal fill 710 is a continuation of metal fill 310 in second metal level M2 and air seam 712 is a continuation of air seam 320 in second metal level M2. Subsequently, third metal level M3 may be formed over metal level M2. The process as described with respect to FIGS. 1-9 may be repeated for metal level M3. However, it is to be understood that the description with respect to the process in active area 104 may be slightly different depending on the semiconductor structures that are desired to be formed in active area 104 in metal level M3. That is, a crack stop structure 704 may be formed over crack stop structure 702 such that crack stop structure 704 is a continuation of crack stop structure 702 in third metal level M3. Crack stop structure 704 may include metal fill 720 and air seam 722 such that metal fill 720 is a continuation of metal fills 310, 710 in third metal level M3 and air seam 722 is a continuation of air seams 320, 712 in third metal level M3. Further, metal level M4 may be formed over metal level M3. The process as described with respect to FIGS. 1-9 may be repeated for fourth metal level M4. However, it is to be understood that the description with respect to the process in active area 104 may be slightly different depending on the semiconductor structures that are desired to be formed in active area 104 in fourth metal level M4. That is, a crack stop structure 706 may be formed over crack stop structure 704 such that crack stop structure 706 is a continuation of crack stop structure 704 in fourth metal level M4. Crack stop structure 706 may include metal fill 730 and air seam 732 such that metal fill 730 is a continuation of metal fills 310, 710, 720 in fourth metal level M4 and air seam 722 is a continuation of air seams 320, 712, 722 in fourth metal level M4.

Figure 12:
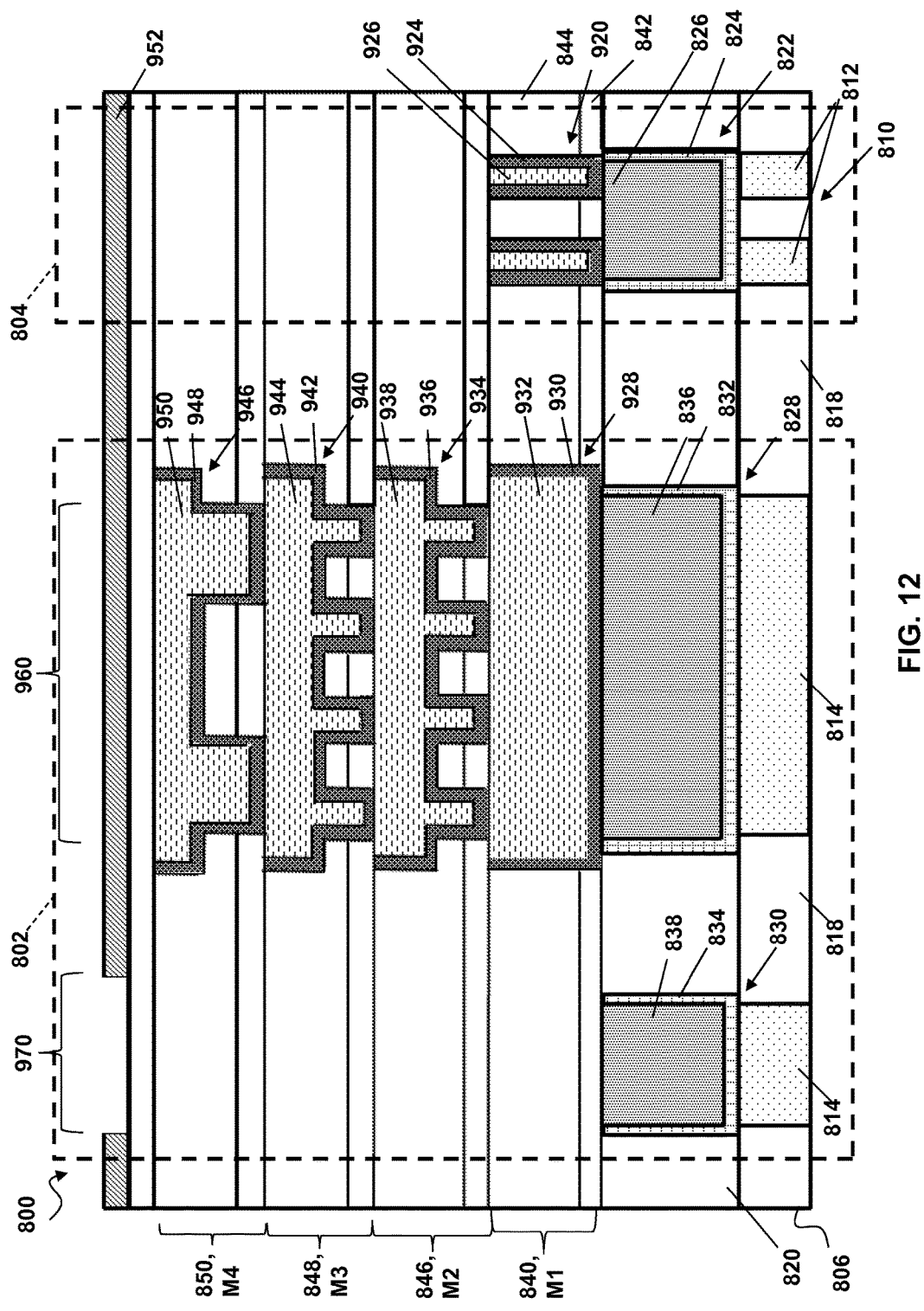
FIGS. 12-14 show an integrated circuit being processed in a method according other embodiments of the disclosure.
Figure 13:
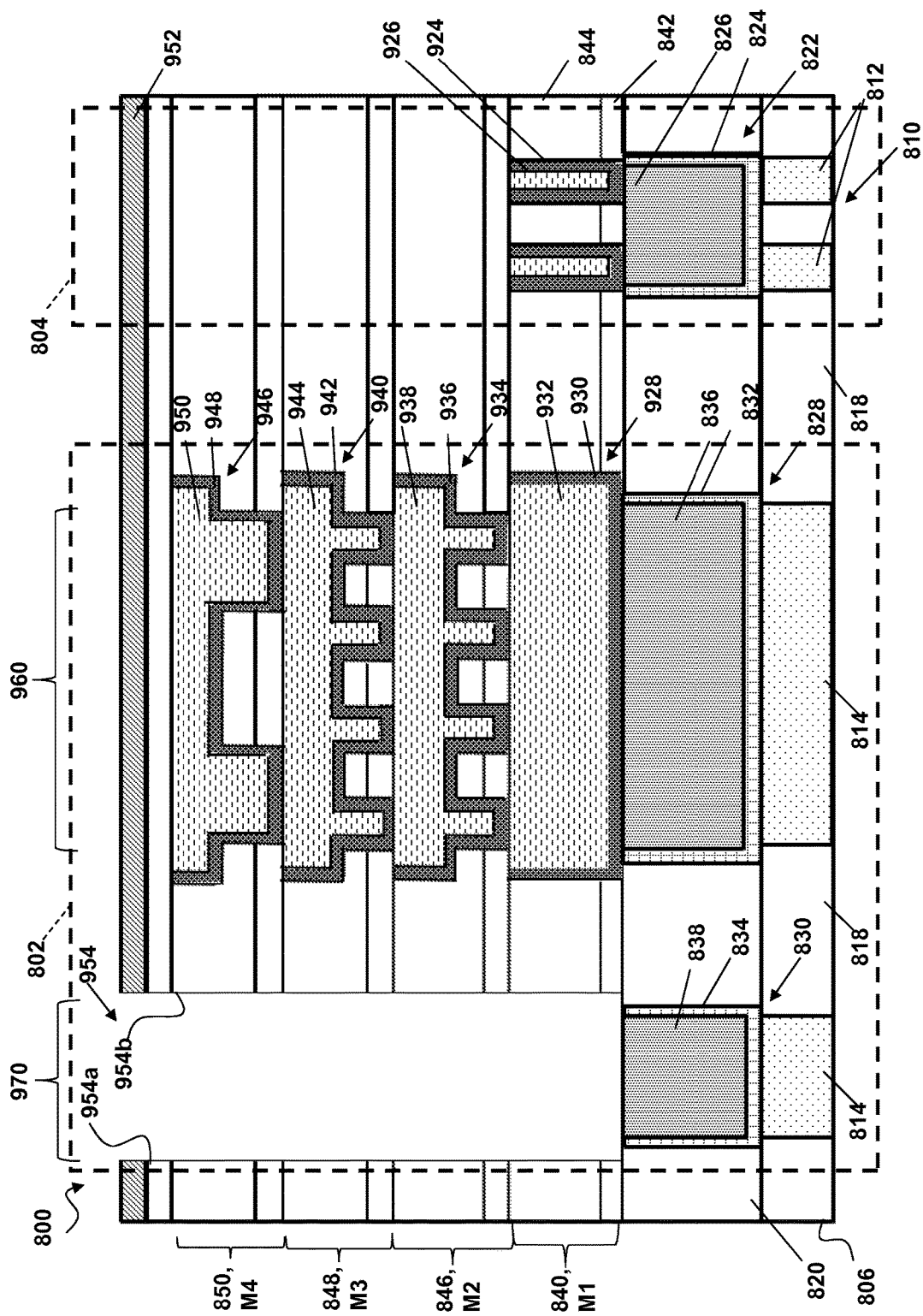
Figure 14:
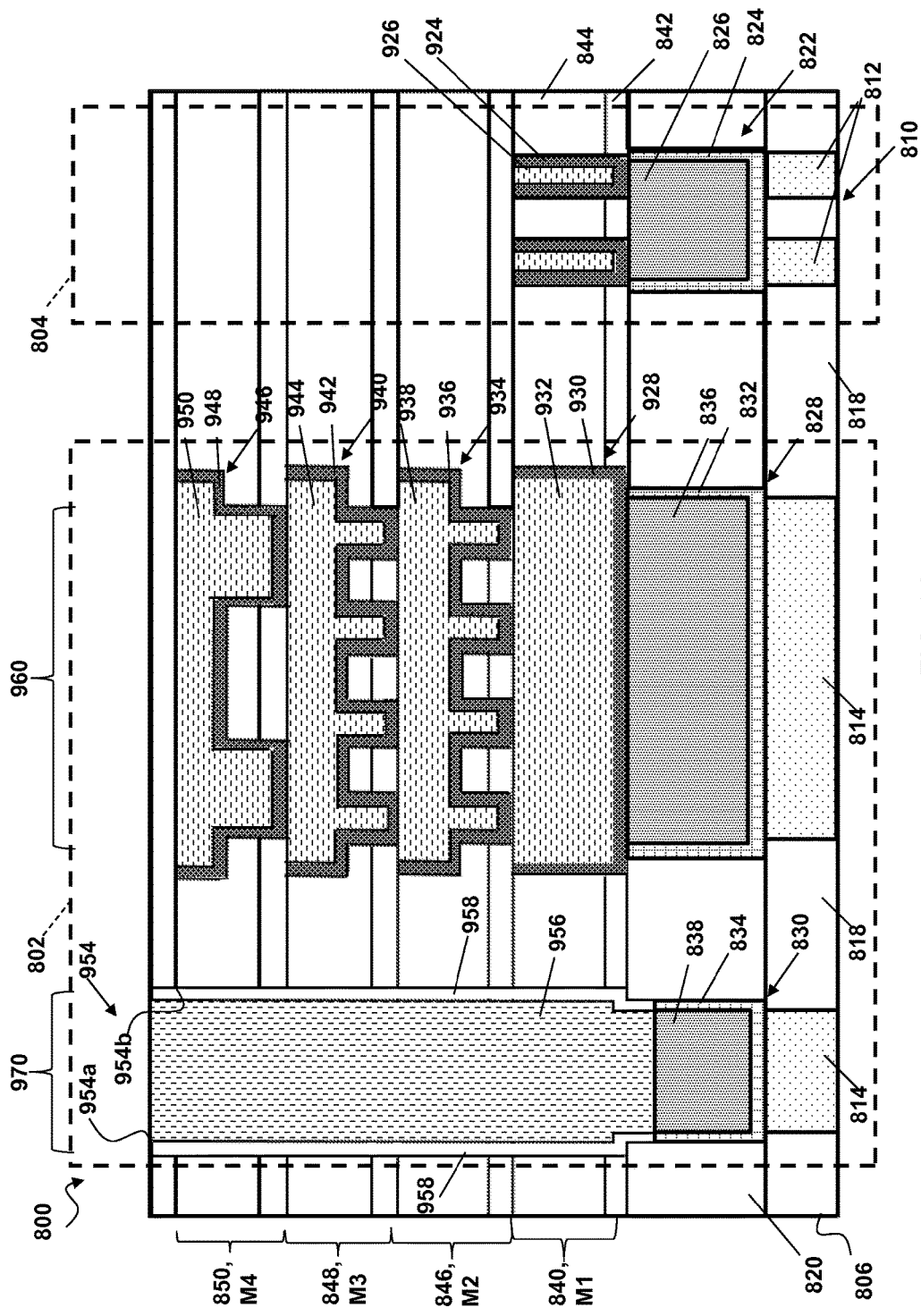

Referring now to FIGS. 12-14, another embodiment according to aspects of the disclosure will be described. In this embodiment, the crack stop structure acts as a crack stop assist feature. That is, in the crack stop area of the integrated circuit structure, the crack stop structure according to this embodiment of this disclosure is formed laterally adjacent to a conventional crack stop structure in the crack stop area.

As shown in FIG. 12, an integrated circuit (IC) structure 800 may include a crack stop area 802 laterally adjacent to an active area 804 as described with respect to the previous embodiments. IC structure 800 may include a substrate 806. In active area 804, substrate 806 may include a semiconductor device, such as for example, a fin-shaped field-effect transistor (FINFET) 810 having a pair of fins 812 as previously described with respect to FIG. 1. It is to be understood that FINFET 810 may include an epitaxial layer over each fin 812 and a gate stack known in the art but not included herein for brevity. FINFET 810 may be formed by conventional deposition and photolithography techniques as known in the art. It is also to be understood that FINFET 810 is shown as an example, but other semiconductor structures may be formed in active area 804. In crack stop area 802, a semiconductor layer 814 may be formed. Semiconductor layers 814 may be formed by etching an opening and depositing a semiconductor material therein. Subsequently, a planarization technique may be employed such that semiconductor layer 814 is flush with a top surface of the opening. Semiconductor layers 814 and fins 812 may include any of the materials listed for semiconductor layer 116 and fins 114 described with reference to FIG. 1. Substrate 806 can also include shallow trench isolations (STIs) 818 positioned laterally between, e.g., semiconductor layers 814 and fins 812. STI(s) 818 can be formed by removing portions of substrate 106 to form openings and then filling the openings with an electrically insulative material as previously described.

Additionally, a middle of the line (MOL) stack 820 may be formed on substrate 806. MOL stack 820 may include any of the dielectric materials used for MOL stack 120 described with reference to FIG. 1. Within MOL stack 820, a contact 822 may be formed in active area 804. Contact 822 may include a liner layer 824 and a metal fill 826 as discussed with reference to FIG. 1. While contact 822 is formed, metal structures 828, 830 may be formed in crack stop area 802. Metal structures 828, 830 in crack stop area 802 may each include a liner layer 832, 834 and a metal fill 836, 838 which may include the liner layer materials and metal fill layer materials previously discussed. Since contact 822 and metal structures 828, 830 are formed simultaneously, liner layers 824, 832, 834 will typically be of the same material and metal fills 836, 836, 838 will typically be of the same material. However, as previously explained, there is no current that flows through crack stop area 802 so no current will flow through metal structures 828, 830 of crack stop area 802.

Still referring to FIG. 12, a dielectric layer 840 may be formed over MOL stack 820 such that dielectric layer 840 defines a first metal level M1. Dielectric layer 840 may include a plurality of layers such that dielectric layer 840 may be considered as a dielectric stack. Dielectric layer 840 may formed by first depositing a barrier low-k layer 842 over MOL stack 820. Additionally, a low-k ILD 844 may also be deposited. Additional metal structures 920, 928 may be formed in dielectric layer 840 via conventional deposition and etching processes. For example, metal structure 920 may be formed in active area 804 over contact 822. Metal structure 920 may include a liner layer 924 and a metal fill 926. Metal structure 928 may be formed in crack stop area 802 over metal structure 828. Additional dielectric layers 846, 848, 850 may be formed over dielectric layer 840 such that additional metal levels M2, M3, M4 are formed over metal level M1. Further, additional metal structures 934, 940, 946 may be formed over metal structure 928 within metal levels M2, M3, M4 in crack stop area 802. Metal structures 828, 928, 934, 940, 946 may together form crack stop structure 960. Each metal structure 928, 934, 940, 946 may include a liner layer 930, 936, 942, 948 and a metal fill 932, 938, 944, 950. The liner layers and metal fills discussed with respect to this embodiment may include any of the liner layer materials and metal fill materials discussed with respect to the previous embodiments.

For example, second metal level M2 may be formed over first metal level M1. Second metal level M2 may include dielectric layer 846. An opening may be formed in dielectric layer 846 such that metal structure 928 is exposed by the opening. Liner layer 936 may be deposited to substantially coat the opening in second metal level M2 and contact metal structure 928 thereunder. Additionally, metal fill 938 may be deposited to substantially fill the opening. Subsequently, a planarization technique may be performed such that liner layer 936 and metal fill 938 are substantially flush with the opening in second metal layer M2. Third metal level M3 may be formed over second metal level M2. Third metal level M3 may include a dielectric layer 848. An opening may be formed in dielectric layer 848 such that metal structure 934 is exposed by the opening. Liner layer 942 may be deposited to substantially coat the opening in third metal level M3 and contact metal structure 934 thereunder. Additionally, metal fill 944 may be deposited to substantially fill the opening. Subsequently, a planarization technique may be performed such that liner layer 942 and metal fill 944 are substantially flush with the opening in third metal level M3. Fourth metal level M4 may be formed over third metal level M3. Fourth metal level M4 may include a dielectric layer 850. An opening may be formed in dielectric layer 850 such that metal structure 940 is exposed by the opening. Liner layer 948 may be deposited to substantially coat the opening in fourth metal level M4 and contact metal structure 940 thereunder. Additionally, metal fill 948 may be deposited to substantially fill the opening. Subsequently, a planarization technique may be performed such that liner layer 948 and metal fill 950 are substantially flush with the opening in fourth metal level M4.

Still referring to FIG. 12, once additional metal levels M2, M3, M4 and metal structures 928, 934, 946 are formed, a photoresist 952 may be formed and patterned to expose a portion of metal layer M4 over metal structure 830 in crack stop area 802 to form the crack stop assist feature. As shown in FIG. 13, an etch may be performed to remove portions of metal levels M1, M2, M3, M4 such that an opening 954 is created to expose metal structure 830 in crack stop area 802. As shown in FIG. 14, a wet etch may be performed to remove a portion of metal structure 830. Subsequently, photoresist 952 may be removed and another metal fill 956 may be formed in opening 954. Metal fill 956 may include any of the materials previously discussed with respect to metal fill 310 as described with reference to FIGS. 6-11. As such, opening 954 will not be completely filled. Due to the selective nature of metal fill 956, metal fill 956 only deposits on metals and not dielectrics. Therefore, as shown in FIG. 14, metal fill 956 will bond with metal fill 838 in metal structure 830 and air seams 958 may be formed between metal fill 956 and dielectric layers 840, 846, 848, 850 at sidewalls 954a, 954b of opening 954. The resulting integrated circuit structure 800 includes crack stop structure 970 having an air seam 958 laterally adjacent to crack stop structure 960 without an air seam in crack stop area 802. Crack stop structures 960, 970 may each extend from first metal level M1 to the uppermost metal level (metal level M4 as shown in this example) on substrate 806. As discussed with reference to FIG. 6, air seams 958 may have a width of approximately 1 angstrom to approximately 10 angstroms. Further, metal fill 956 will not be deposited in active area 804 or over metal structure 828 since no metals are exposed. As previously discussed, air seams 958 prevent the propagation of cracks past crack stop area 802 and protect active area 804. Metal fill 932 may be distinct from metal fill 956. In one example, metal fill 836, 838 of metal structures 828, 830 may include tungsten (W), metal fill 956 may include cobalt (Co) and metal fill 932 may include copper (Cu). In this example, metal fill 826 of contact 822 in active area 804 may also include tungsten (W). In another example, metal fills 836, 838, 956 may include cobalt (Co) and metal fill 932 may include copper (Cu). In this example, metal fill layer 826 of contact 822 in active area 804 may also include cobalt (Co).

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. An integrated circuit structure comprising:
   a first metal structure in a first dielectric layer on a substrate in a crack stop area; and
   a first crack stop structure in a second dielectric layer, the first crack stop structure being over the first metal structure and including:
   a first metal fill contacting the first metal structure; and
   an air seam substantially separating the first metal fill and the second dielectric layer.

2. The integrated circuit structure of claim 1, wherein the first metal fill includes at least one of: cobalt, tungsten, and aluminum.

3. The integrated circuit structure of claim 1, wherein the air seam has a width of approximately 1 angstrom to approximately 10 angstroms.

4. The integrated circuit structure of claim 1, wherein the crack stop area is laterally adjacent to an active area, the active area including:
   at least one semiconductor device in the substrate; and
   a contact in the first dielectric layer, the contact being in contact with the semiconductor device and substantially separated from the first metal structure by the first dielectric layer.

5. The integrated circuit structure of claim 4, wherein the contact includes at least one of tungsten or cobalt.

6. The integrated circuit structure of claim 1, further comprising:
   a second metal structure laterally adjacent to the first metal structure, the second metal structure being substantially separated from the first metal structure by the first dielectric layer; and
   a second crack stop structure in the crack stop area and laterally adjacent to the first crack stop structure, the second crack stop structure being over the second metal structure and including:
   a liner layer contacting the second metal structure; and
   a second metal fill contacting the liner layer.

7. The integrated circuit structure of claim 1, wherein the second dielectric layer defines a first metal level, and further comprising:
   a second metal level having a second crack stop structure in a third dielectric layer over the first crack stop structure.

8. The integrated circuit structure of claim 7, wherein the second crack stop structure includes a second metal fill and a second air seam, the second metal fill being a continuation of the first metal fill into the second metal level and the second air seam being a continuation of the first air seam into the second metal level.

9. The integrated circuit structure of claim 7, wherein the second crack stop structure includes a second liner layer and a second metal fill.

10. The integrated circuit structure of claim 1, wherein the first crack stop structure extends from the first dielectric layer to an uppermost metal level on the substrate.

11. An integrated circuit structure comprising:
    a first metal level including:
    a first metal structure in a first dielectric layer on a substrate in a crack stop area; and
    a first crack stop structure in a second dielectric layer, the first crack stop structure being over the first metal structure and including:
    a first metal fill contacting the first metal structure; and
    an air seam substantially separating the first metal fill and the second dielectric layer, the air seam having a width of approximately 1 angstrom to 10 approximately angstroms;
    wherein the first crack stop structure extends from the first dielectric layer to an uppermost metal level on the substrate.

* * * * *